United States Patent [19]

Miyashita

[11] Patent Number: 5,903,587
[45] Date of Patent: May 11, 1999

[54] STRESS COMPENSATION TYPE SEMICONDUCTOR LASER

[75] Inventor: Motoharu Miyashita, Tokyo, Japan

[73] Assignee: Mitsubishi Denki Kabushiki Kaisha, Tokyo, Japan

[21] Appl. No.: 09/037,019

[22] Filed: Mar. 9, 1998

[30] Foreign Application Priority Data

Sep. 30, 1997 [JP] Japan ................................. 9-266489

[51] Int. Cl.⁶ ........................................................ H01S 3/19
[52] U.S. Cl. ............................................... 372/45; 372/44
[58] Field of Search .................................. 372/44, 45, 46, 372/50

[56] References Cited

U.S. PATENT DOCUMENTS 5,673,283  9/1997  Kajikawa et al. ........................... 372/46

FOREIGN PATENT DOCUMENTS 774425  3/1995  Japan .

OTHER PUBLICATIONS

Maree et al, "Generation of Misfit Dislocations in Semiconductors", Journal of Applied Physics, vol. 62, No. 11, pp. 4413–4420, Dec. 1, 1987.

Zhang et al., "Strain–Compensated InGaAs/GaAsP/GaInAsP/GaInP Quantum Well Lasers λ–0.98μm) Grown By Gas–Source Molecular Beam Epitaxy", Applied Physics Letters, vol. 62, No. 14, Apr. 1993, pp. 1644–1646.

*Primary Examiner*—Rodney Bovernick
*Assistant Examiner*—Quyen Phan Leung
*Attorney, Agent, or Firm*—Leydig, Voit & Mayer

[57] ABSTRACT

A stress compensation type semiconductor laser emitting laser light of 0.98 μm~1.02 μm wavelength includes a semiconductor substrate, a cladding layer disposed on the semiconductor substrate, and a multiple quantum well structure active layer disposed on the cladding layer and comprising a plurality of well layers and barrier layers. In the laser, when the number, strain, and thickness of the well layers are n, $f_w$, and $t_w$, respectively, and the number, strain, and thickness of the barrier layers are m, $f_b$, and $t_b$, respectively, the average strain $f_{av}$ of the well layers and the barrier layers, and the total thickness $t_{total}$ of the well layers and the barrier layers is given by $$f_{av} = (nf_w t_w + mf_b t_b)/t_{total}$$
$$f_{av} > 0$$
$$f_{av}^2 t_{total} < \frac{1}{2} \frac{b_p(1-\nu/2)}{80\sqrt{3}(1+\nu)}\left[-\frac{1}{2} + \ln\left(\frac{4r_c}{b_0}\right)\right]$$

where υ is the Poisson ratio, $b_o$ is the magnitude of a Burgers vector of a perfect dislocation, $b_p$ is the magnitude of a Burgers vector of partial dislocation, and $r_c$ is the half loop radius of a dislocation. Therefore, an active layer having required stress compensation performance is realized with high reliability and high reproducibility.

8 Claims, 2 Drawing Sheets

STRESS COMPENSATION TYPE SEMICONDUCTOR LASER

FIELD OF THE INVENTION

The present invention relates to semiconductor lasers and, more particularly, to a semiconductor laser including an active layer having a stress compensation type multiple quantum well structure.

BACKGROUND OF THE INVENTION

FIG. 3 is a cross-sectional view of a semiconductor laser including an active layer of a stress compensation type multiple quantum well structure, disclosed in, for example, Applied Physics Letter, Vol. 62, No.14 (1993), p.1644.

The semiconductor laser shown in FIG. 3 emits laser light of wavelength 0.98~1.02 μm, and includes an active layer in which plural well layers and plural barrier layers are alternatingly laminated. In the 0.98~1.02 μm band semiconductor laser, the lattice constant of a crystalline semiconductor constituting the well layers must be larger than the lattice constant of a crystalline semiconductor constituting the substrate. However, when there is no lattice-match between the crystalline semiconductors, defects tend to occur due to a stress generated between the crystalline semiconductors. Therefore, the stress generated between the crystalline semiconductors is offset by making the lattice constant of the crystalline semiconductor constituting the barrier layers smaller than that of the crystalline semiconductor constituting the substrate.

To be specific, the semiconductor laser 1 shown in FIG. 3 comprises an n type GaInP lower cladding layer 3, an undoped GaInAsP first light confinement layer 4, an active layer 15, an undoped GaInAsP second light confinement layer 12, a p type GaInP upper cladding layer 13, and a p type GaAs contact layer 14, which are successively disposed on an n type GaAs substrate 2. The active layer 15 comprises an undoped GaAsP first barrier layer 5, an undoped InGaAs first well layer 6, an undoped GaAsP second barrier layer 7, an undoped InGaAs second well layer 8, an undoped GaAsP third barrier layer 9, an undoped InGaAs third well layer 10, and an undoped GaAsP fourth barrier layer 11.

In has an effect of increasing the lattice constant of GaAs, and P has an effect of reducing the lattice constant of GaAs. Using the properties of In and P, the lattice constant of each well layer comprising InGaAs is made larger than that of the substrate 2 comprising GaAs, and the lattice constant of each barrier layer comprising GaAsP is made smaller than that of the substrate 2 comprising GaAs. Thus, the stress generated between the crystalline semiconductors is offset to provide an active layer 15 having required stress compensation performance.

When the respective semiconductor layers described above are grown on the substrate 2, for example, MOCVD (Metal Organic Chemical Vapor Deposition) is employed. However, the following problems arise in the MOCVD growth when switching gases for crystal growth supplied to a reaction furnace.

When the well layers 6, 8, and 10 comprising InGaAs and the barrier layers 5, 7, 9, and 11 comprising GaAsP are alternatingly grown, source gases of these materials should be switched. However, quick switching between the source gas for As (AsH$_3$) and the source gas for P (PH$_3$) is particularly difficult.

This problem will be described in more detail. The composition ratio of As in InGaAs constituting the well layers 6, 8, and 10 is different from the composition ratio of As in GaAsP constituting the barrier layers 5, 7, 9, and 11. In addition, the barrier layers 5, 7, 9, and 11 contain P whereas the well layers 6,8,and 10 do not contain P. Therefore, when the well layers 6, 8, and 10 and the barrier layers 5, 7, 9, and 11 are alternatingly grown, switching of the supply amount of AsH$_3$ gas and switching between suplying and stopping of PH$_3$ gas are performed.

On the other hand, group V gases, such as AsH$_3$ gas and PH$_3$ gas, tend to remain in the reaction furnace and, therefore, reliable switching of the group V gas is not easy. Besides, if the switching of the group V gas is not carried out reliably, desired lattice constants of the well layers 6, 8, and 10 and the barrier layers 5, 7, 9, and 11 are not realized. As a result, an active layer 15 having expected stress compensation performance is not produced. That is, in the prior art laser mentioned above, it is difficult to stably produce the above-described active layer 15.

SUMMARY OF THE INVENTION

It is an object of the present invention to provide a semiconductor laser comprising an active layer having desired stress compensation performance.

Other objects and advantages of the invention will become apparent from the detailed description and specific embodiments described are provided only for illustration since various additions and modifications within the spirit and scope of the invention will be apparent to those of skill in the art from the detailed description.

According to a first aspect of the present invention, there is provided a stress compensation type semiconductor laser emitting laser light of 0.98 μm~1.02 μm, which comprises a semiconductor substrate, a cladding layer disposed on the semiconductor substrate, and a multiple quantum well structure active layer disposed on the cladding layer and comprising a plurality of well layers and barrier layers. In this laser, when the number, strain, and thickness of the well layers are n, $f_w$, and $t_w$, respectively, and the number, strain, and thickness of the barrier layers are m, $f_b$, and $t_b$, respectively, the relationship between the average strain $f_{av}$ of the well layers and the barrier layers, and the total thickness $t_{total}$ of the well layers and the barrier layers is given by $$f_{av} = (nf_w t_w + mf_b t_b)/t_{total}$$
$$f_{av} > 0$$
$$f_{av}^2 t_{total} < \frac{1}{2} \frac{b_p(1-v/2)}{80\sqrt{3}\,(1+v)}\left[-\frac{1}{2} + \ln\left(\frac{4r_c}{b_0}\right)\right]$$

where υ is the Poisson ratio, $b_o$ is the magnitude of Burgers vector of perfect dislocation, $b_p$ is the magnitude of Burgers vector of partial dislocation, and $r_c$ is the half loop radius of dislocation. Therefore, when the well layers and the barrier layers are alternatingly grown, switching of the group V gas is facilitated, so that required lattice constants of the well layers and the barrier layers are obtained with reliability. Accordingly, an active layer having required stress compensation performance is realized with reliability. As a result, a highly-reliable semiconductor laser with reduced crystal defects is realized with high reproducibility.

According to a second aspect of the present invention, in the above-mentioned semiconductor laser, the well layers comprise InGaAs and the barrier layers comprise GaAsP. Since InGaAs and GaAsP are usually employed in fabrication of semiconductor lasers, the active layer can be grown using a conventional apparatus for crystal growth, i.e., it is not necessary to prepare a special apparatus for growing the active layer. Accordingly, a highly-reliable semiconductor laser with reduced crystal defects is obtained with high reproducibility without increasing the cost. Further, since the barrier layers comprise GaAsP, the amount of a source gas producing P is reduced as compared with the case of employing InGaAsP, resulting in an active layer with more reliability.

According to a third aspect of the present invention, in the above-mentioned semiconductor laser, the cladding layer comprises AlGaAs. Therefore, the amount of a source gas producing P is reduced as compared with the case of employing InGaP, resulting in an active layer with more reliability.

According to a fourth aspect of the present invention, in the above-mentioned semiconductor laser, assuming that the compressive strain has a positive quantity, the number of the well layers is 2 to 4, the strain of the well layer is 0.008 to 0.015, the thickness of each well layer is 0.005 μm to 0.02 μm, the number of the barrier layers is 3 to 5, the strain of the barrier layers is −0.01 to 0, and the thickness of each barrier layer is 0.005 μm to 0.03 μm. By setting the conditions of the well layers and the barrier layers as mentioned above, threshold current characteristics and temperature characteristics of the semiconductor layer are maintained satisfactorily, resulting in a high performance semiconductor laser.

DETAILED DESCRIPTION OF THE PREFERRED EMBODIMENTS

Figure 1:
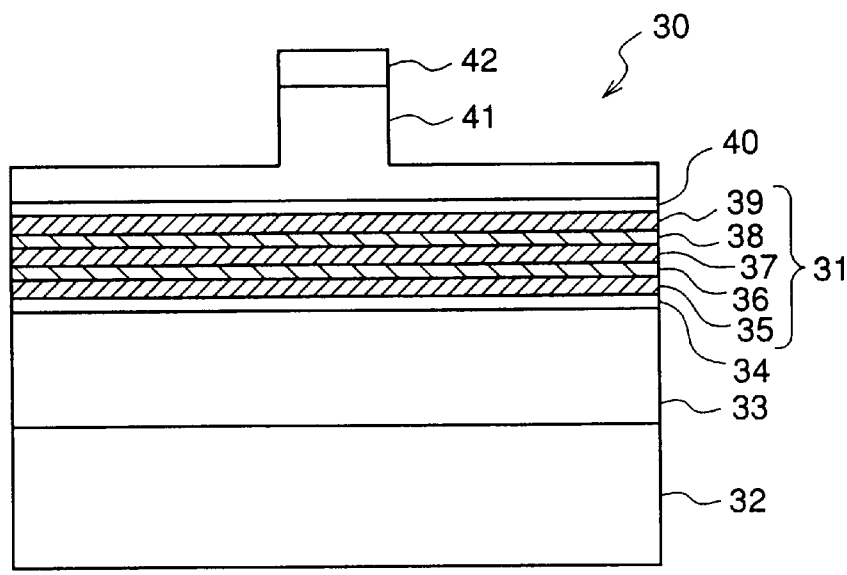
FIG. 1 is a cross-sectional view schematically illustrating a semiconductor laser according to an embodiment of the present invention.

FIG. 1 is a cross-sectional view of a major part of a semiconductor laser 30 according to an embodiment of the present invention.

The semiconductor laser 30 is a stress compensation type semiconductor laser emitting laser light of 0.98 μm 1.02 μm, and this laser 30 includes a multiple quantum well structure active layer (hereinafter referred to as MQW active layer) 31 comprising, alternatingly laminated, two well layers 36 and 38 and three barrier layers 35, 37, and 39.

The semiconductor laser 30 includes an n type GaAs substrate 32. There are successively disposed on the substrate 32, an n type $Al_{0.3}Ga_{0.7}As$ lower cladding layer 33, an undoped $Al_{0.2}Ga_{0.8}As$ first light confinement layer 34, an undoped $GaAs_{0.9}P_{0.1}$ first barrier layer 35, an undoped $In_{0.18}Ga_{0.82}As$ first well layer 36, an undoped $GaAs_{0.9}P_{0.1}$ second barrier layer 37, an undoped $In_{0.18}Ga_{0.82}As$ second well layer 38, an undoped $GaAs_{0.9}P_{0.1}$ third barrier layer 39, an undoped $Al_{0.2}Ga_{0.8}As$ second light confinement layer 40, a p type $Al_{0.3}Ga_{0.7}As$ upper cladding layer 41, and a p type GaAs contact layer 42.

The thicknesses of the respective layers are as follows. The lower cladding layer 33 is 1.6 μm thick, each of the first and second light confinement layers 34 and 40 is 0.02 μm thick, each of the first, second and third barrier layers 35, 37 and 39 is 0.01 μm thick, each of the first and second well layers 36 and 38 is 0.008 μm thick, the upper cladding layer 41 is 1.6 μm thick, and the contact layer 42 is 0.2 μm thick.

The strain of the undoped $GaAs_{0.9}P_{0.1}$ first, second, and third barrier layers 35, 37, and 39 is −0.4%, and the strain of the undoped $In_{0.18}Ga_{0.82}As$ first and second well layers 36 and 38 is +1.3%. The positive sign (+) shows compressive strain and the negative sign (−) shows tensile strain.

Since the total thickness $t_{total}$ of the well layers 36 and 38, and the barrier layers 35, 37, and 39 is 0.046 μm, the average strain $f_{av}$ is given by $$f_{av}=(nf_w t_w + m f_b t_b)/t_{total}$$

where n is the number of the well layers, $f_w$ is the strain of the well layers, $t_w$ is the thickness of each well layer, m is the number of the barrier layers, $f_b$ is the strain of the barrier layers, and $t_b$ is the thickness of each barrier layer. In this embodiment of the invention, n=2, $f_w$=+1.3%, $t_w$=0.008, m=3, $f_b$=−0.4%, and $t_b$=0.01. When this equation is solved with these numerical values, the average strain $f_{av}$ is +0.2%.

Further, this result satisfies $f_{av}>0$.

In this embodiment of the invention, the Maree's equation that defines the relationship between the thickness of a thin semiconductor layer and the strain thereof is applied to the active layer 31 comprising a plurality of the semiconductor layers, whereby desired lattice constants of the well layers 36 and 38 and of the barrier layers 35, 37 and, 39 are realized when the active layer 31 is fabricated, resulting in a semiconductor laser with expected stable stress compensation performance.

The Maree's equation applied to the embodiment of the invention is $$f_{av}^2 t_{total} = \frac{b_p(1-\nu/2)}{80\sqrt{3}\,(1+\nu)}\left[-\frac{1}{2}+\ln\left(\frac{4r_c}{b_0}\right)\right]$$

where $\nu$ is the Poisson ratio of the active layer 31, $b_0$ is the Burgers vector magnitude of a perfect dislocation, $b_p$ is the Burgers vector magnitude of a partial dislocation, and $r_c$ is the half loop radius of dislocation. These numerical values depend on the materials constituting the active layer 31. Note that, in this embodiment, the Poisson ratio $\nu$ is 0.31, the Burgers vector magnitude $b_0$ of a perfect dislocation is 4.0Å, the Burgers vector magnitude $b_p$ of partial dislocation is 2.3Å, and the half loop radius $r_c$ of dislocation is 844Å.

Figure 2:
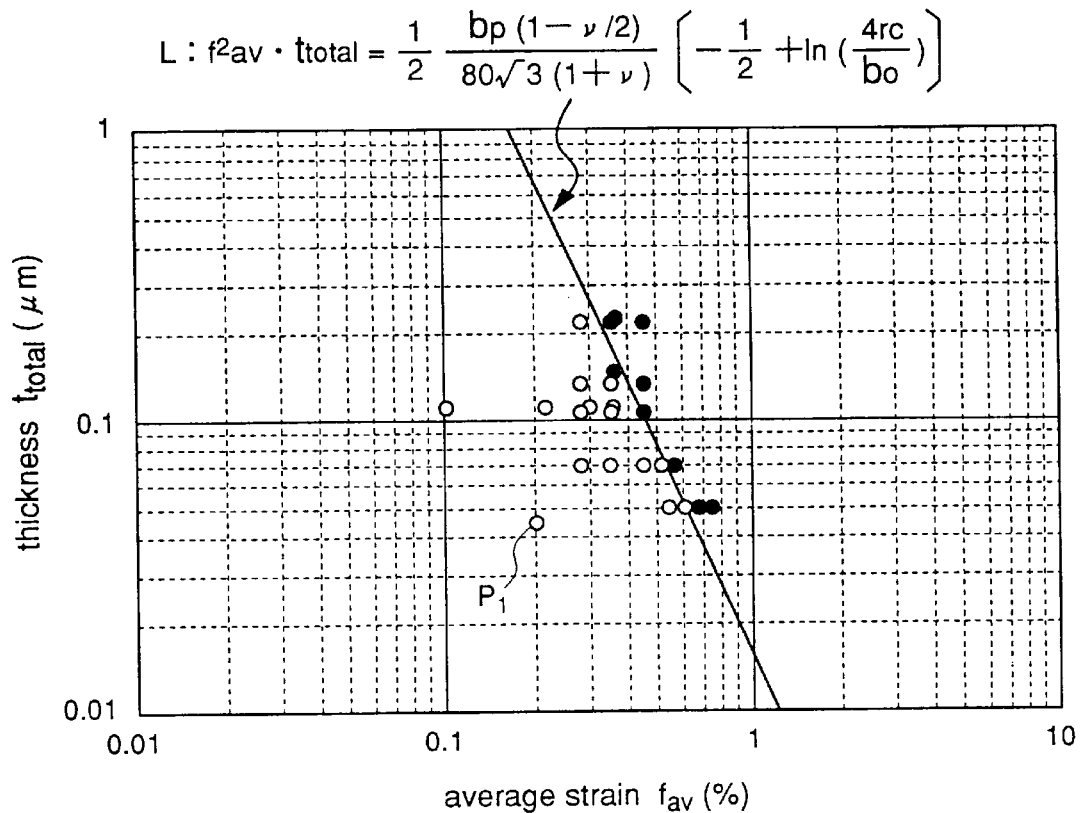
FIG. 2 is a diagram showing the result of examination using a photoluminescence method, for the presence of defects in various MQW (Multiple Quantum Well) active layers comprising, alternatingly laminated, InGaAs well layers and GaAsP barrier layers.
Figure 3:
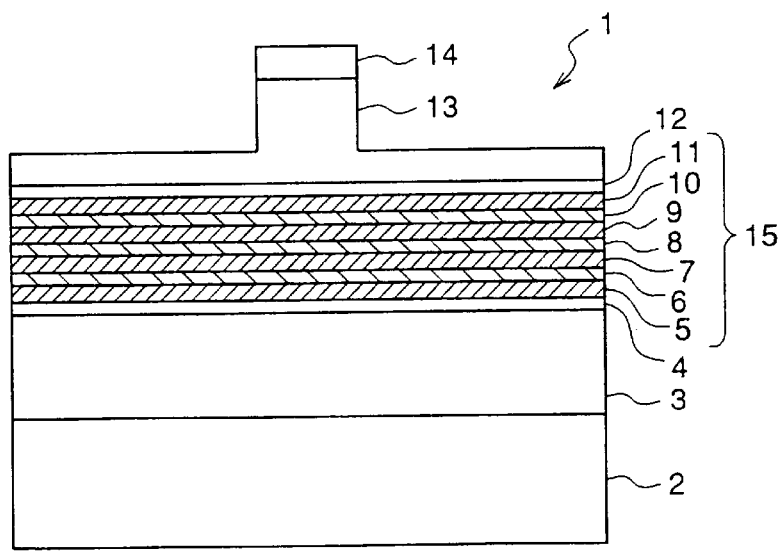
FIG. 3 is a cross-sectional view schematically illustrating a semiconductor laser according to the prior art.

FIG. 2 is a graph showing the relationship defined by $$f_{av}^2 t_{total} = \frac{1}{2}\frac{b_p(1-\nu/2)}{80\sqrt{3}\,(1+\nu)}\left[-\frac{1}{2}+\ln\left(\frac{4r_c}{b_0}\right)\right] \quad (4)$$

This equation (4) is obtained by multiplying the right side of the Maree's equation by the coefficient ½. In the graph, the ordinate shows the total thickness $t_{total}$ of the well layers 36 and 38 and the barrier layers 35, 37, and 39, and the abscissa shows the average strain $f_{av}$ of the well layers 36 and 38 and the barrier layers 35, 37 and 39. The straight line L satisfies the relationship of equation (4).

A plurality of samples of active layers comprising InGaAs well layers and GaAsP barrier layers were fabricated while varying the number, strain, and thickness of the well layers and the barrier layers, and then these samples were examined with a photoluminescence method to determine whether any defects (darklines) occur in the samples. White plots and black plots shown in FIG. 2 indicate the result of the examination. In the figure, the white plots show samples where no defects are found and the black plots show samples where defects are found.

The white plot of reference character $P_1$ shows the result of the examination with respect to the semiconductor laser 30 according to the embodiment of the invention. That is, in the semiconductor laser 30, since the active layer 31 has the above-mentioned structure, no defects occur in the active layer 31. In addition, the active layer 31 satisfies $f_{av}>0$, i.e., the average strain $f_{av}$ of the well layers 36 and 38 and the barrier layers 35, 37, and 39 in the active layer 31 is a positive quantity. Since the InGaAs well layers 36, and 38 are compressively strained and the GaAsP barrier layers 35, 37, and 39, are tensively strained with respect to the GaAs substrate 32, the fact that the average strain $f_{av}$ is a positive quantity means that the strain of the GaAsP barrier layers 35, 37, and 39 is reduced. That is, it means that the change in flow rate of $AsH_3$ gas providing As and the change in flow rate of $PH_3$ gas providing P are small when the active layer 31 is grown. Accordingly, when the well layers 36 and 38 and the barrier layers 35, 37, and 39 are alternatingly grown, switching of the group V gas is facilitated, so that the required lattice constants of the well layers 36 and 38 and the barrier layers 35, 37, and 39 are obtained with high reliability. As a result, an active layer having required stress compensation performance is fabricated with high reliability and high reproducibility.

Particularly, in this embodiment of the invention, since the well layers 36 and 38 comprise InGaAs and the barrier layers 35, 37, and 39 comprise GaAsP, which materials are usually employed in fabrication of semiconductor lasers, the active layer 31 can be grown using a conventional apparatus for crystal growth, i.e., it is not necessary to prepare a special apparatus for growing the active layer 31.

Further, to employ GaAsP as a material of the barrier layer makes formation of the active layer 31 more reliable. The reason is as follows. The barrier layer may comprise, for example, InGaAsP instead of GaAsP. However, when In is included as a constituent in the barrier layer, since In increases the lattice constant of the barrier layer, the barrier layer must include more P to offset the increase in the lattice constant. Therefore, the amount of $PH_3$ gas switched, which provides P, must be increased, resulting in an inconvenience that precise switching of the group V gas is hardly realized. As opposed to this, in the embodiment of the present invention, the barrier layers 35, 37, and 39 comprise GaAsP, so that reliable formation of the active layer 31 is realized without such inconvenience.

With reference to FIG. 2, not only in the embodiment of the invention, but generally, in the region where expression (3) is satisfied, i.e., on the left side of the straight line L, no defects occur in the active layer. That is, by forming the active layer so that expressions (1)~(3) are satisfied, a semiconductor laser comprising an active layer having no defects is fabricated, resulting in the effects mentioned above.

Furthermore, to employ AlGaAs as a material of the lower cladding layer 33 and the upper cladding layer 41 makes formation of the active layer 31 more reliable. The reason is as follows.

The cladding layer may comprise, for example, InGaP instead of AlGaAs. However, when the cladding layer comprises InGaP, the amount of $PH_3$ gas switched, which provides P, must be increased when the well layers are grown, resulting in an inconvenience that precise switching of the group V gas is hardly realized. As opposed to this, in the embodiment of the invention, since the cladding layers 33 and 41 comprise AlGaAs, only a small amount of $PH_3$ gas is switched when the active layer 31 is grown and, therefore, the above-mentioned inconvenience does not arise. As a result, more reliable formation of the active layer 31 is realized.

Furthermore, the structure of the active layer 31 of the semiconductor laser 30 according to the embodiment of the invention is not restricted to that shown in FIG. 1. The same effects as those provided by the semiconductor laser 30 is realized by setting the number, strain, and thickness of the well layers to 2~4, 0.008~0.015, and 0.005~0.02 μm, respectively, and setting the number, strain, and thickness of the barrier layers to 3~5, −0.01~0, and 0.005~0.03μm, respectively. Further, threshold current characteristics and temperature characteristics of the semiconductor laser are satisfactorily maintained by forming the active layer under the conditions mentioned above.

What is claimed is:

1. A stress compensation type semiconductor laser emitting laser light of wavelength 0.98 μm–1.02 μm, comprising:
   a semiconductor substrate;
   a cladding layer disposed on said semiconductor substrate; and
   a multiple quantum well structure active layer disposed on said cladding layer and comprising a plurality of well layers and barrier layers wherein, when the number, strain, and thickness of said well layers are n, $f_w$, and $t_w$, respectively, and the number, strain, and thickness of said barrier layers are m, $f_b$, and $t_b$, respectively, the relationship between the average strain $f_{av}$ of said well layers and said barrier layers, and the total thickness $t_{total}$ of said well layers and said barrier layers is $$f_{av} = (nf_w t_w + mf_b t_b)/t_{total}$$
$$f_{av} > 0$$
$$f_{av}^2 t_{total} < \frac{1}{2}\frac{b_p(1-v/2)}{80\sqrt{3}(1+v)}\left[-\frac{1}{2} + \ln\left(\frac{4r_c}{b_0}\right)\right]$$

where υ is the Poisson ratio, $b_o$ is the magnitude of a Burgers vector of a perfect dislocation, $b_p$ is the magnitude of a Burgers vector of a partial dislocation, and $r_c$, is the half loop radius of a dislocation.

2. The stress compensation type semiconductor laser of claim 1 wherein, assuming that compressive strain is positive, the laser includes two to four of said well layers, the strain of said well layers is 0.008 to 0.015, and each well layer is 0.005 μm to 0.02 μm thick, and includes three to five of said barrier layers, the strain of said barrier layers is −0.01 to 0, and each barrier layer is 0.005 μm to 0.03 μm thick.

3. The stress compensation type semicoductor laser of claim 1 wherein said well layers comprise InGaAs and said barrier layers comprise GaAsP.

4. The stress compensation type semiconductor laser of claim 3 wherein said cladding layer comprises AlGaAs.

5. The stress compensation type semiconductor laser of claim 4 wherein, assuming that compressive strain is positive, the laser includes two to four of said well layers, the strain of said well layers is 0.008 to 0.015, and each well layer is 0.005 μm to 0.02 μm thick, and includes three to five of said barrier layers, the strain of said barrier layers is −0.01 to 0, and each barrier layer is 0.005 μm to 0.03 μm thick.

6. The stress compensation type semiconductor laser of claim 3 wherein, assuming that compressive strain is positive, the laser includes two to four of said well layers, the strain of said well layers is 0.008 to 0.015, and each well layer is 0.005 μm to 0.02 μm thick, and includes three to five of said barrier layers, the strain of said barrier layers is −0.01 to 0, and each barrier layer is 0.005 μm to 0.03 μm thick.

7. The stress compensation type semiconductor laser of claim 1 wherein said cladding layer comprises AlGaAs.

8. The stress compensation type semiconductor laser of claim 7 wherein, assuming that compressive strain is positive, the laser includes two to four of said well layers, the strain of said well layers is 0.008 to 0.015, and each well layer is 0.005 $\mu$m to 0.02 $\mu$m thick, and includes three to five of said barrier layers, the strain of said barrier layers is $-0.01$ to 0, and each barrier layer is 0.005 $\mu$m to 0.03 $\mu$m thick.

* * * * *